US009941092B2

(12) United States Patent
Greenland et al.

(10) Patent No.: US 9,941,092 B2
(45) Date of Patent: Apr. 10, 2018

(54) X-RAY ASSEMBLIES AND COATINGS

(71) Applicant: VAREX IMAGING CORPORATION, Salt Lake City, UT (US)

(72) Inventors: Kasey Otho Greenland, West Jordan, UT (US); Robert S. Miller, Sandy, UT (US)

(73) Assignee: VAREX IMAGING CORPORATION, Salt Lake City, UT (US)

( * ) Notice: Subject to any disclaimer, the term of this patent is extended or adjusted under 35 U.S.C. 154(b) by 543 days.

(21) Appl. No.: 14/559,747

(22) Filed: Dec. 3, 2014

(65) Prior Publication Data
US 2016/0163497 A1 Jun. 9, 2016

(51) Int. Cl.
*H01J 35/00* (2006.01)
*H01J 35/08* (2006.01)
*C23C 4/08* (2016.01)
*C23C 4/12* (2016.01)
*C23C 14/14* (2006.01)
*C23C 14/24* (2006.01)
*C23C 16/06* (2006.01)
*H01J 35/06* (2006.01)
*H01J 35/18* (2006.01)

(52) U.S. Cl.
CPC .............. *H01J 35/08* (2013.01); *C23C 4/08* (2013.01); *C23C 4/12* (2013.01); *C23C 4/122* (2013.01); *C23C 4/127* (2013.01); *C23C 14/14* (2013.01); *C23C 14/24* (2013.01); *C23C 16/06* (2013.01); *H01J 35/06* (2013.01); *H01J 35/18* (2013.01); *H01J 2235/06* (2013.01); *H01J 2235/081* (2013.01); *H01J 2235/088* (2013.01); *H01J 2235/168* (2013.01); *H01J 2235/18* (2013.01)

(58) Field of Classification Search
CPC ........................... H01J 2235/081; H01J 35/08
See application file for complete search history.

(56) References Cited

U.S. PATENT DOCUMENTS 6,075,839 A    6/2000 Treseder
6,690,765 B1   2/2004 Miller
(Continued)

FOREIGN PATENT DOCUMENTS

DE   2301007 A1   8/1973
EP   1089317 A1   4/2001
(Continued)

OTHER PUBLICATIONS

European Search Report completed May 2, 2016 in European Patent Application No. EP 15195801.

*Primary Examiner* — Dani Fox
(74) *Attorney, Agent, or Firm* — Maschoff Brennan

(57) ABSTRACT

The disclosed subject matter includes devices and methods relating to anode assemblies and/or X-ray assemblies. In some aspects, a method of forming an X-ray assembly may include providing an anode base formed of a first material and including a first end. The method may include depositing a second material different from the first material over a first surface of the anode base to form a coated portion of the anode base. The coated portion may be configured such that some backscattered electrons do not travel beyond the coated portion.

17 Claims, 5 Drawing Sheets

(56) References Cited

U.S. PATENT DOCUMENTS

| | | | |
|---|---|---|---|
| 7,593,509 B2 | 9/2009 | Richardson et al. | |
| 2004/0165699 A1 | 8/2004 | Rusch et al. | |
| 2011/0007872 A1* | 1/2011 | Steinlage | H01J 35/10 378/62 |

FOREIGN PATENT DOCUMENTS

| | | |
|---|---|---|
| GB | 619083 A | 3/1949 |
| GB | 2133208 A | 7/1984 |
| JP | S54-74073 U | 5/1979 |
| JP | 2009-205811 A | 9/2009 |

* cited by examiner

X-RAY ASSEMBLIES AND COATINGS

BACKGROUND

The present disclosure generally relates to assemblies that generate X-rays and methods of forming X-ray assemblies. X-ray assemblies may be used for analyzing samples, X-ray imaging, sterilizing, and other applications. X-ray assemblies may generally include a cathode that directs a stream of electrons into a vacuum, and an anode that receives the electrons. When the electrons collide with a target on the anode, some of the energy may be emitted as X-rays, and some of energy may be released as heat. The emitted X-rays may be directed at samples to determine information about the samples.

The claimed subject matter is not limited to embodiments that solve any disadvantages or that operate only in environments such as those described above. This background is only provided to illustrate one exemplary technology area where some of the described embodiments may be practiced.

SUMMARY

The present disclosure generally relates to X-ray assemblies and methods of forming X-ray assemblies.

In one example embodiment, an anode assembly may include an anode base, a target and a deposited material. The anode base may be formed of a first material and may include a taper between a first portion with a first cross-sectional dimension and a second portion with a second cross-sectional dimension greater than the first cross-sectional dimension. The target may define an X-ray emission face positioned on a first end of the anode base at the first portion. The target may include a second material different from the first material. The deposited material may be positioned over a coated portion of the anode base. The deposited material may include the second material and the coated portion may extend a coated length from the first end.

In some aspects, a method of forming an X-ray assembly may include providing an anode base formed of a first material and including a first end. The method may include depositing a second material different from the first material over a first surface of the anode base to form a coated portion of the anode base. The coated portion may be configured such that some backscattered electrons do not travel beyond the coated portion.

This Summary introduces a selection of concepts in a simplified form that are further described below in the Detailed Description. This Summary does not indicate key features, essential characteristics, or the scope of the claimed subject matter.

DETAILED DESCRIPTION

Reference will now be made to the figures wherein like structures will be provided with like reference designations.

The drawings are non-limiting, diagrammatic, and schematic representations of example embodiments, and are not necessarily drawn to scale.

The figures depict various features of example embodiments, generally directed to X-ray assemblies with cathode assemblies and anode assemblies housed within a vacuum envelope. The X-ray assemblies may generate X-rays directed at samples to obtain information about the samples.

Figure 1:
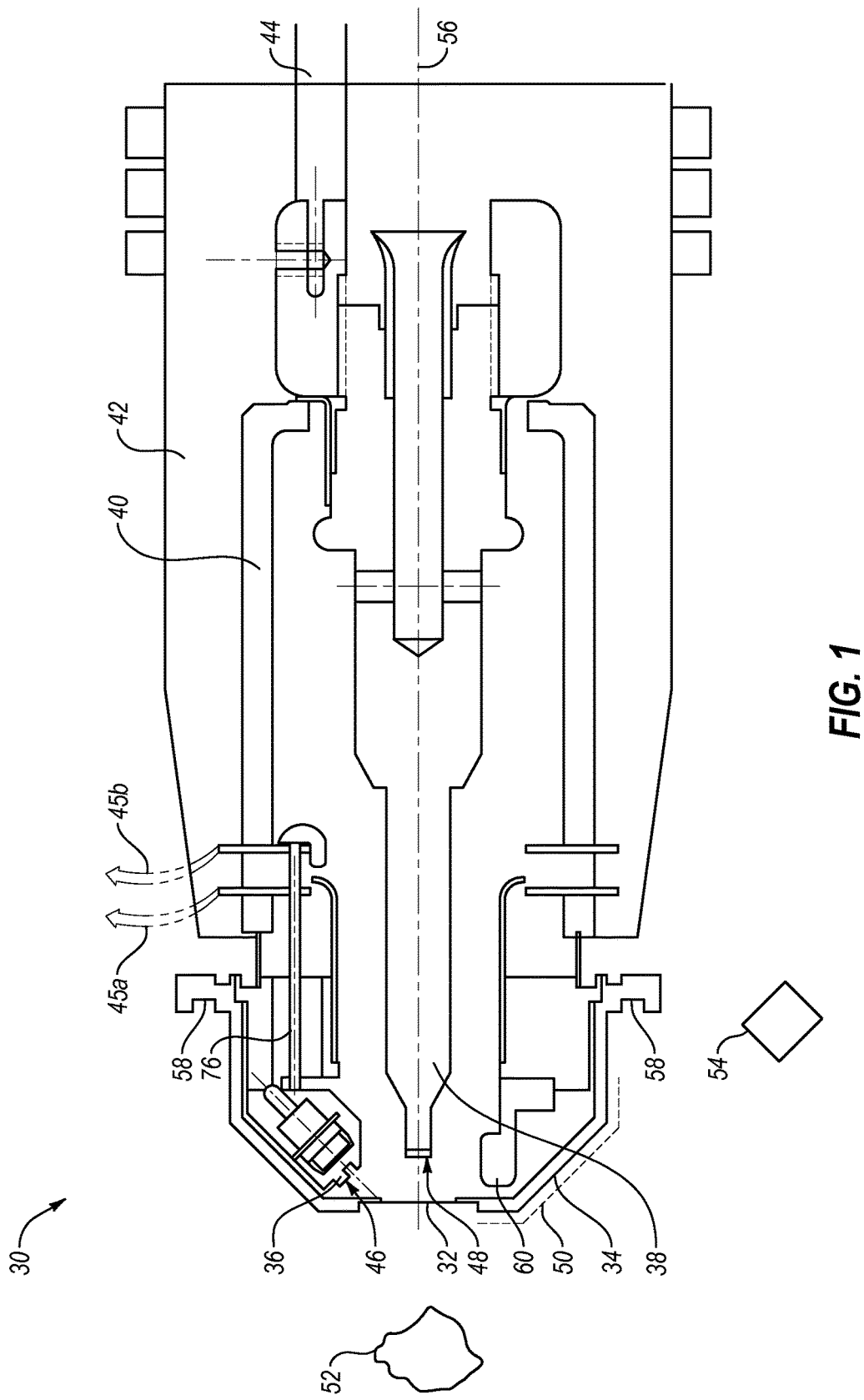
FIG. 1 is a view of an embodiment of an X-ray assembly.
Figure 2A:
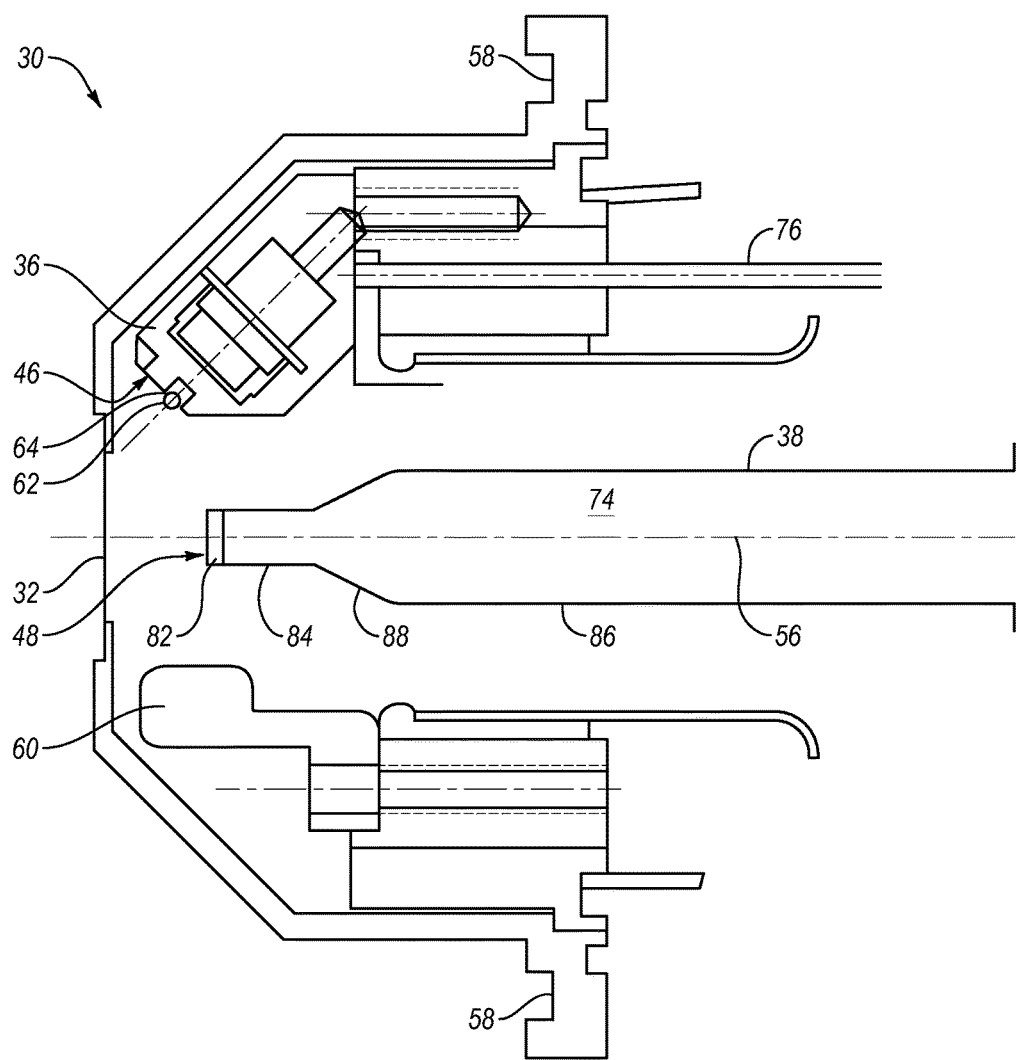
FIG. 2A is a view of a portion of the X-ray assembly of FIG. 1.

FIG. 1 illustrates an example of an X-ray assembly 30 for an X-ray fluorescence instrument. FIG. 2A illustrates a more detailed view of a portion of the X-ray assembly 30 of FIG. 1. With combined reference to FIGS. 1 and 2A, the X-ray assembly 30 will be described in further detail. The X-ray assembly 30 may be an X-ray source and/or an X-ray tube. The X-ray assembly 30 includes a body extending between a first end and a second end. An X-ray emission window 32 may be positioned at the first end of the X-ray assembly 30. A cathode assembly 36 and an anode assembly 38 may be housed within a vacuum envelope 34 of the X-ray assembly 30. The anode assembly 38 may include a target 82 (indicated in FIG. 2A, label omitted for clarity in FIG. 1) positioned near the X-ray emission window 32 and spaced apart from the X-ray emission window 32.

The anode assembly 38 may be configured to operate at a voltage of 50 Kilovolts (kV), and/or within suitable tolerances. In other configurations, the anode assembly 38 can be configured to operate at any other suitable voltage level. The vacuum envelope 34 may be partially enclosed by any suitable insulator such as a high voltage insulator 40. The high voltage insulator 40 may be surrounded by a potting material 42 forming a portion of the body of the X-ray assembly 30. An anode lead 44 may be electrically coupled to the anode assembly 38 and two filament leads 45a and 45b may be electrically coupled to the cathode assembly 36. At least one energy detector 54 may be positioned near a sample 52 to receive radiation from the sample 52.

In operation, electrons are emitted from an electron emission face 46 of the cathode assembly 36 and travel toward an X-ray emission face 48 of the anode assembly 38. Some of the electrons that collide with the X-ray emission face 48 of the target 82 may generate X-rays. The X-ray emission window 32 may permit some of the X-rays to travel from the X-ray assembly 30 toward the sample 52.

When electrons collide with the X-ray emission face 48, the characteristics of the emitted radiation (e.g. wavelength, frequency, photon energy, and/or other characteristics) may depend on the composition of the target 82 and/or the voltage of the anode assembly 38. The target 82 may be formed of a variety of materials depending on the desired characteristics of the emitted radiation. In some configurations, the target 82 may be formed at least in part of rhodium (Rh), palladium (Pd), tungsten (W), silver (Ag), chromium (Cr), titanium (Ti), molybdenum (Mo) or other suitable materials. Additionally or alternatively, in some configurations the voltage of the anode assembly 38 may be 50 Kilovolts (kV).

Some of the generated X-rays may travel from the X-ray emission face 48 of the target 82, through the X-ray emission window 32, and may incident the sample 52. Depending on the properties of the sample 52 and the wavelength of the X-rays, some of the X-rays projected on the sample 52 may pass through the sample 52, some may be absorbed by the sample 52, and/or some may be reflected by the sample 52. The energy detector 54 may detect some of the energy emitted (or fluoresced) from the irradiated sample 52, and information about the sample 52 may be obtained.

For example, when the sample 52 is exposed to radiation such as X-rays with energy greater than the ionization potential of atoms of the sample 52, the atoms may become ionized and eject electrons. In some circumstances, the X-rays may be energetic enough to expel tightly held electrons from the inner orbitals of the atoms. This may make the electronic structure of the atoms unstable, and electrons in higher orbitals of the atoms may "fall" into the lower orbital to fill the hole left behind. In falling, energy may be released in the form of radiation, the energy of which may be equal to the energy difference of the two orbitals involved. As a result, the sample 52 may emit radiation, which has energy characteristics of its atoms, and some of the emitted radiation may be received by the energy detector 54.

The energy detector may receive radiation including radiation emitted from the sample 52. The energy detector may detect characteristics of the received radiation, such as energy level, wavelength, or other characteristics. The characteristics of the received radiation may be used to determine characteristics of the sample 52. For example, in some configurations, the characteristics of the received radiation may be used to determine aspects of the material composition of the sample 52.

A nose 50 of the X-ray assembly 30, indicated by the dashed line, may be the portion of the X-ray assembly 30 that is to be positioned near the sample 52. As illustrated, the electron emission face 46 of the cathode assembly 36 and/or the X-ray emission face 48 of the anode assembly 38 may be generally oriented towards the X-ray emission window 32. In such configurations, the dimensions of the nose 50 may be minimized, which may prevent the nose 50 from interfering with or blocking energy being radiated from the sample 52. Such configurations may also permit the X-ray emission face 48 to be positioned close to the sample 52 without contacting the nose 50 or the X-ray emission window 32. Positioning the X-ray emission face 48 close to the sample 52 may permit stronger and/or shorter wavelength X-rays to be projected onto the sample 52 and/or may decrease dissipation and/or scattering of the X-rays. Positioning the X-ray emission face 48 close to the sample 52 may result in higher intensity X-rays to be projected onto the sample 52. Additionally or alternatively, such configurations may permit the energy detector 54 to be positioned close to the sample 52 to improve reception of energy radiated from the sample 52.

As illustrated, an X-ray assembly axis 56 may extend through the center of both the X-ray assembly 30 and the anode assembly 38, which are concentric. In other configurations, the body of the X-ray assembly 30 and the anode assembly 38 may not be concentric and the X-ray assembly axis 56 may extend through the center of only one the X-ray assembly 30 or the anode assembly 38.

In some configurations the energy detector 54 may be positioned at substantially a forty five degree (45°) angle relative to the X-ray assembly axis 56, as illustrated. When the sample 52 is present, the energy detector 54 may be directed at the sample 52 in a direction that is also substantially at a forty five degree (45°) angle relative to the X-ray assembly axis 56. The nose 50 may be configured (e.g. shaped and/or dimensioned) such that it does not interfere with a detected direction that is angled forty five degrees (45°) relative to the X-ray assembly axis 56.

Additionally or alternatively, in some configurations the cathode assembly 36 may be positioned at substantially a forty five degree (45°) angle relative to the X-ray assembly axis 56 as illustrated. In such configurations, the cathode assembly 36 may be angled in a radial direction opposite of the angle of the energy detector 54 as illustrated. In other configurations, the cathode assembly 36 may be angled in the same radial direction as the energy detector 54. In such configurations, the direction of the cathode assembly 36 may be substantially parallel to the direction of the energy detector 54, but the two directions may not be collinear to permit the nose 50 to be configured (e.g. shaped and/or dimensioned) such that the nose 50 does not interfere with radiation travelling from the sample 52 to the energy detector 54. Although the angled configurations described above include forty five degree (45°) angles, in other configurations the angles may be varied and may include any suitable angles.

In some configurations, the sample 52 may be positioned within a vacuum chamber (not shown) to be irradiated. In such configurations, an O-ring groove 58 may circumscribe the body of the X-ray assembly 30 and the O-ring groove 58 may contribute to providing at seal for the vacuum chamber. In other configurations, the O-ring groove 58 may be omitted and other seals or couplings may be used to provide a vacuum chamber around the sample 52.

The cathode assembly 36 may include an electron emitter 62 such as cathode filament and a focusing slot 64. As illustrated, in some configurations the cathode assembly 36 may include a focusing slot 64 with the electron emitter 62 positioned partially inside of the focusing slot 64. The electron emitter 62 may be formed of any suitable material, such as tungsten. An electrical coupling 76 may couple the electron emitter 62 to the filament leads 45*a* and 45*b*. Specifically, a first lead of the electrical coupling 76 may be electrically coupled to the filament lead 45*a* and a second lead of the electrical coupling 76 may be electrically coupled to the filament lead 45*b*. The first lead and the second lead may extend through the cathode assembly 36 and terminate on opposite sides of the electron emitter 62 with the electron emitter 62 positioned in between the first and the second leads (not illustrated).

In operation, an electrical current may be applied between the first and second leads resulting in electrons colliding with the electron emitter 62 positioned in between. The electrons may then be ejected from the cathode assembly 36 and may travel towards the anode assembly 38.

The focusing slot 64 may be configured to focus a width of an electron beam generated by the electron emitter 62. In non-illustrated configurations, the electron emitter 62 may be positioned entirely inside of the focusing slot 64. In other configurations, the electron emitter 62 may be positioned entirely outside of the focusing slot 64. In such configurations, the electron emitter 62 may be positioned near and aligned with the focusing slot 64.

In some configurations where the electron emitter 62 is a filament, positioning the electron emitter 62 outside of the focusing slot 64 may have advantages such as improving purveyance, permitting the electron emitter 62 to supply a suitable level of electron emissions at smaller voltage levels. Additionally or alternatively, the electron emitter 62 may be operated at a lower temperature and/or may have a longer operating life because there is less deterioration and/or evaporation of the material the electron emitter 62 is formed from. Another advantage is that the placement of an electron emitter 62 in a cathode assembly 36 may be much easier than in other cathode assembly designs. Furthermore, the electron emitter 62 may be placed much more precisely, even when utilizing various different designs of X-ray tubes. Positioning the electron emitter 62 outside of the focusing slot 64 may simplify positioning of the electron emitter 62, may facilitate precise placement of the electron emitter 62 and/or may facilitate in decreasing production costs of the X-ray assembly 30.

The X-ray assembly 30 may be suitable for low power X-ray fluorescence applications. In some configurations, the X-ray assembly 30 may operate at 50 watts or less. The low power configuration of the X-ray assembly 30 may permit the X-ray assembly 30 to be cooled by simple cooling methods such as passive air-cooling, forced air-cooling or conductive cooling. In some configurations, the potting material 42 may be thermally conductive to facilitate cooling.

As illustrated, the target 82 may be positioned on the tip of the anode assembly 38. The configuration (e.g., size, shape, and/or positioning) of the target 82 may be influenced by a variety of factors. For example, the size of the target 82 may be minimized because the materials that the target 82 is formed of (rhodium, palladium, tungsten, silver, chromium, titanium, molybdenum, etc.) may be expensive. In another example, the configuration of the target 82 may be selected to decrease spectral impurities emitted from the anode assembly 38. In yet another example, the shape and positioning of the target 82 may be selected to facilitate attaching the target 82 to the anode assembly 38.

In some configurations, the target 82 may be coupled to the anode assembly 38 by brazing. Brazing the target 82 may be advantageous because brazing may: facilitate tighter control of tolerances; facilitate uniform heating of the materials; decrease thermal distortion of the joined materials; and/or facilitate producing clean joints. In some circumstances, brazing may be a relatively expensive process. For example, brazing may employ a large amount of material and that material may be expensive in some circumstances. In some circumstances, if the target 82 is formed of silver, brazing may not be suitable to couple the target 82 to the anode assembly 38.

In some configurations, the target 82 may be coupled to the anode assembly 38 by casting. In some configurations, the target 82 and the anode assembly 38 may be complementarily threaded such that the target 82 may be screwed into the anode assembly 38. In other configurations, the target 82 may be mechanically coupled to the anode assembly 38 by any suitable fastening configuration. In some configurations, forming the target 82 may include secondary finishing steps such as machining or polishing to smooth the surface of the target 82.

Figure 2B:
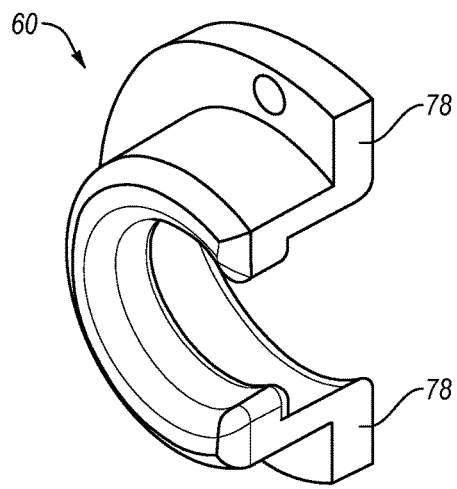
FIG. 2B is a view of a portion of the X-ray assembly of FIG. 1.
Figure 3:
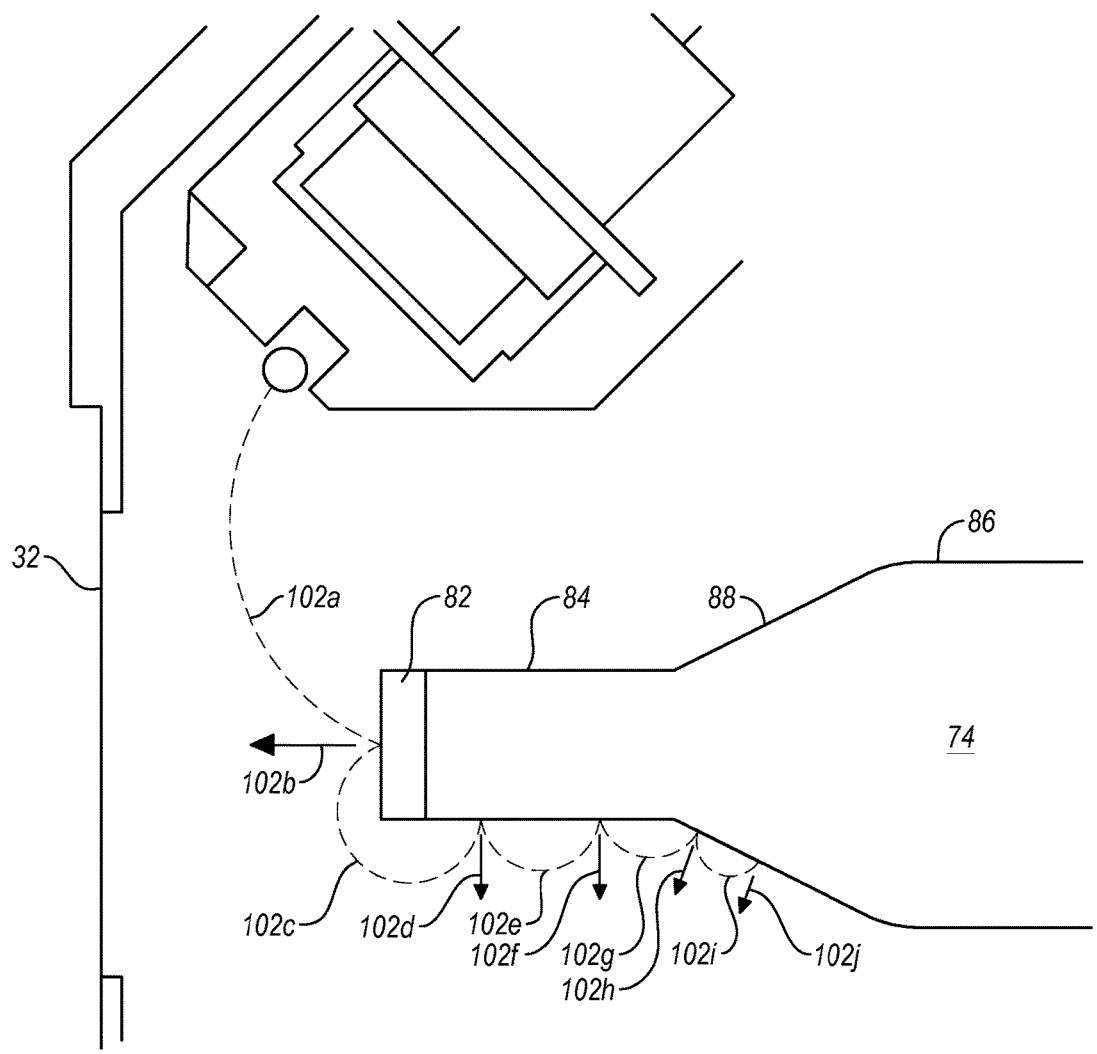
FIG. 3 is a view of a portion of the X-ray assembly of FIG. 1.

FIGS. 2B and 3 are views of a portion of the X-ray assembly of FIG. 1. With combined reference to FIGS. 2B and 3, aspects of a portion of the X-ray assembly 30 will be discussed in further detail. Labeling of some of the components of the X-ray assembly 30 are omitted for clarity. The electron emitter 62 may generate a flux of electrons that may travel various paths. The electrons, which are negatively charged, may be attracted to the anode because it is positively charged. A majority of the electrons may travel from the electron emission face 46 towards the X-ray emission face 48.

The X-ray assembly 30 may include a focusing electrode 60, which is illustrated in further detail in FIG. 2B. The focusing electrode 60 may be configured to focus electrons travelling from the electron emission face 46 to the X-ray emission face 48. For example, the focusing electrode 60 may generate an electric field that contributes in guiding electrons toward the X-ray emission face 48. As illustrated, the focusing electrode 60 may include a U-shaped configuration. The focusing electrode 60 may be positioned around at least a portion of the anode assembly 38. Specifically, the focusing electrode 60 may be positioned around the X-ray emission face 48 of the anode assembly 38. The U-shaped configuration may terminate at ends 66, which may be positioned near the cathode assembly 36. In some configurations, the ends 66 may be positioned just short of physical contact with the cathode assembly 36. In such configurations, the cathode assembly 36 and the U-shaped focusing electrode 60 may collectively form a circular structure. In other configurations, the focusing electrode 60 can include any suitable shape and/or dimension for focusing. Electrical forces generated by the electron focusing electrode 60 may contribute in guiding electrons toward the target 82. Some of the electrons may impact the target 82 and may either be absorbed or they may rebound.

FIG. 3 illustrates some example travel paths of electrons emitted by the electron emitter 62. An electron may travel from the electron emission face 46 towards the X-ray emission face 48 as illustrated by electron path 102a. The electron may impact the X-ray emission face 48 and/or may be absorbed by the target 82 resulting in an emission of radiation 102b. The characteristics of the emitted radiation 102b (e.g., wavelength, frequency and/or energy) may depend on the material of the target 82, the energy of the impacting electrons, the voltage of the X-ray assembly 30, and/or other aspects. Accordingly, the material of the target 82 may be such that the emitted radiation 102b is X-ray radiation. The emitted radiation 102b may travel towards the X-ray emission window 32 and through the X-ray emission window 32 towards the sample 52.

Some of the electrons impacting the target 82 may be backscattered instead of being absorbed by the target 82. The likelihood of electrons backscattering may depend on a variety of factors such as the material of the target 82, the energy of the impacting electrons, the voltage of the X-ray assembly 30, and/or other aspects. In some configurations, about 50% of the electrons may be backscattered. In some configurations, 30% to 60% of the electrons may be backscattered. Backscattered electrons may rebound off of the X-ray emission face 48 after impacting the target 82 as illustrated by electron path 102c. The rebounding electrons may travel along the length of the anode assembly 38. In some configurations, the positive charge of the anode assembly 38 and/or electrical forces generated by the electron focusing electrode 60 that guide the electrons toward the target 82 may contribute in directing the rebounding electrons along the length of the anode assembly 38.

At the end of electron path 102c, the electrons may impact a side of the anode assembly 38 and may either be absorbed causing a radiation emission 102d or may rebound again as indicated by electron path 102e. Electrons that rebound again may travel along electron path 102e and impact the side of the anode assembly 38 further along the length of the anode assembly 38, for example, at the end of electron path 102e. The impacting electrons may either be absorbed causing a radiation emission 102f or rebound yet again as indicated by electron path 102g. Electrons that rebound again may travel along electron path 102g and impact the side of the anode assembly 38 further along the length of the anode assembly 38, for example, at the end of electron path 102g. The impacting electrons may either be absorbed causing a radiation emission 102h or rebound yet again as indicated by electron path 102i. Electrons that rebound again may travel along electron path 102i and impact the side of the anode assembly 38 further along the length of the anode assembly 38, for example, at the end of electron path 102i. The impacting electrons may either be absorbed causing a radiation emission 102j or rebound yet again (not illustrated). Some of the electrons may continue rebounding along the length of the anode assembly 38 further than illustrated by electron paths 102*c*, 102*e*, 102*g* and 102*i*.

At any point of impact along the length of the anode assembly 38, an electron may either be absorbed or rebound. The likelihood of electrons rebounding may depend on a variety of factors such as the characteristics of the impacted material, the energy of the impacting electrons, the voltage of the X-ray assembly 30, and/or other aspects. The amount of rebounding electrons may decrease along the length of the anode assembly 38. For example, the amount of rebounding electrons may decrease with each successive rebound between the electron paths 102*c*, 102*e*, 102*g* and 102*i*. In some configurations, roughly 30% of the electrons impacting the anode assembly 38 may rebound from the anode assembly 38 upon impact. Although the illustrated electron paths and emitted radiation 102*c*-102*j* are illustrated on one side of the anode assembly 38, rebounding electrons may travel along the anode assembly 38 on any side.

If a rebounding electron does not rebound it may instead be absorbed resulting in an emission of radiation, such as radiation emission 102*d*, 102*f*, 102*h*, or 102*j*. Although the emitted radiation 102*d*, 102*f*, 102*h*, and 102*j* are illustrated at certain points along the length of the anode assembly 38, rebounding electrons may impact at other points along the length of the anode assembly 38 and/or may be absorbed resulting in emitted radiation at other points of impact along the length of the anode assembly 38. The characteristics of the emitted radiation (e.g., wavelength, frequency and/or energy) from rebounding electrons may depend on the characteristics of the impacted material, the energy of the impacting electrons, the voltage of the X-ray assembly 30, and/or other aspects. In some configurations, the anode assembly 38 and the target 82 may be formed of different materials or may include different materials.

In some configurations, the anode assembly 38 may include an anode base 74 formed of or including a material with a high thermal conductivity. In some configurations, the anode base 74 may include copper or may be formed entirely of copper. In some configurations, the anode base 74 may include the portions of the anode assembly 38 that are not the target 82. Anode assemblies that include copper may be referred to as copper anode assemblies. In some configurations, the target 82 may be formed of rhodium, palladium, tungsten, silver, chromium, titanium, molybdenum or other suitable materials.

In configurations where the anode base 74 includes an exposed material different from the target 82 material, the emitted radiation 102*d*, 102*f*, 102*h*, or 102*j* from rebounding electrons may cause spectral impurities because the emitted radiation 102*d*, 102*f*, 102*h*, or 102*j* may include different characteristics than the emitted radiation 102*b* from electrons absorbed by the target 82. The spectral impurities may be undesirable for obtaining information about the sample 52 with the energy detector 54. For example, the spectral impurities may interfere with the information detected by the energy detector 54.

Additionally or alternatively, the characteristics of the emitted radiation (e.g., wavelength, frequency and/or energy) from rebounding electrons may depend on the number of rebounds of the electron. For example, the characteristics of the emitted radiation from electrons rebounding one time may be more undesirable for obtaining information about the sample 52 than the characteristics of the emitted radiation from electrons rebounding two times, three times and so on. Specifically, the emitted radiation from electrons rebounding one time may result in more interference and/or noise than emitted radiation from electrons rebounding two times, three times, and so on.

The X-ray assembly 30 may be configured to decrease, minimize or prevent the emitted radiation from rebounding electrons to travel through the X-ray emission window 32, towards the sample 52 and/or towards the energy detector 54. For example, in some configurations, the X-ray assembly 30 may include a view factor (the configuration factor, form factor and/or shape factor) such that some of the emitted radiation from rebounding electrons does not travel towards the X-ray emission window 32.

As illustrated in FIG. 3, the anode assembly 38 may include a first portion 84 and a second portion 86 with a taper 88 in between such that the second portion 86 includes at least one dimension (e.g. width, thickness, height, diameter, cross-sectional dimension, cross-sectional area, etc.) greater than a corresponding dimension (e.g. width, thickness, height, diameter, cross-sectional dimension, cross-sectional area, etc.) of the first portion 84. The X-ray emission face 48 may be positioned on a first end of the anode assembly 38 on the first portion 84. The target 82 may be positioned on the first end and/or may cover the entire tip of the anode assembly 38 such that a large portion of electrons impact the target 82 rather than other portions of the anode assembly 38.

A cross-sectional dimension of the first portion 84 may be substantially the same as the area of the X-ray emission face 48. The second portion 86 may include at least one dimension (e.g. width, thickness, height, diameter, cross-sectional dimension, cross-sectional area, etc.) greater than a corresponding dimension (e.g. width, thickness, height, diameter, cross-sectional dimension, cross-sectional area, etc.) of the first portion 84 to facilitate heat dissipation of the anode assembly 38. A cross-sectional dimension of the second portion 86 may be greater than the cross-sectional dimension of the first portion 84. The cross-sectional dimensions of the first portion 84 and the second portion 86 may contribute to the heat dissipating characteristics of the anode assembly 38. The anode assembly 38 may dissipate heat by conduction and/or heat emission. In some configurations, the first portion 84 may cylindrical, the taper 88 may be conical, and/or the second portion 86 may be cylindrical.

The sides of the first portion 84 may be transverse and/or orthogonal to the X-ray emission window 32. This may contribute to decreasing emissions of rebounding electrons in directions towards the X-ray emission window 32. The taper 88 may be positioned the length of the first portion 84 away from the target 82. The length of the first portion 84 may be such that a small portion or none of the rebounding electrons reach the taper 88 when the X-ray assembly 30 is operating. Additionally or alternatively, the second portion 86 may be positioned a distance from the target 82 such that rebounding electrons are not likely to reach the second portion 86.

In non-illustrated configurations, the target may be larger and extend further down the length of the anode assembly 38. In such configurations, rebounding electrons may impact the target rather than other materials of the anode assembly 38, thereby decreasing spectral impurities. However, this may decrease heat dissipation because the material of the target may be a poorer thermal conductor than the material of the anode assembly 38. If heat dissipation is decreased then the operating conditions and/or reliability of the X-ray assembly 30 may be decreased. Furthermore, the material of the target may be expensive and configurations with larger targets may increase material costs. Additionally or alternatively, production costs may be increased because the production process is more difficult.

Figure 4:
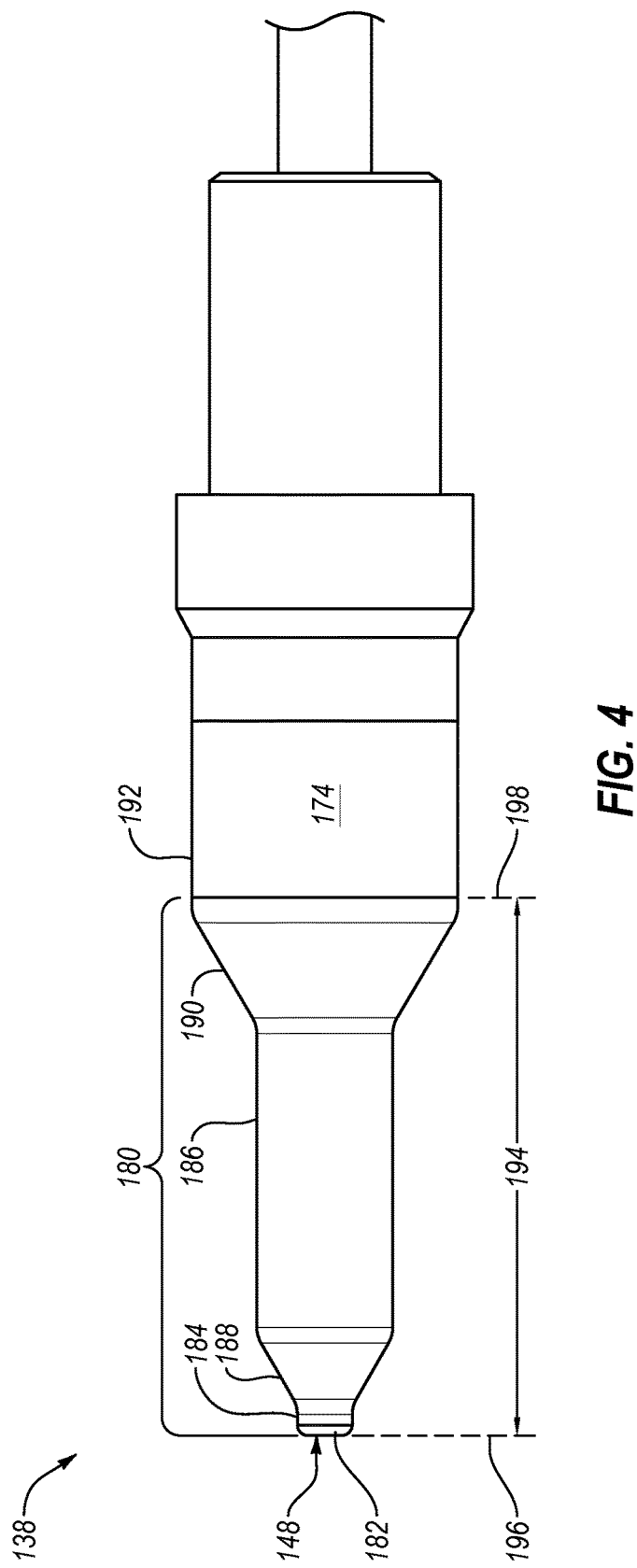
FIG. 4 is a view of a portion of an X-ray assembly.

FIG. 4 is a view of a portion of an X-ray assembly. With reference to FIG. 4, an anode assembly 138 will be described in further detail. The anode assembly 138 may include aspects similar to those of the anode assembly 38, and for clarity and brevity, similar components may include similar numbering, as will be indicated by context. In some configurations, the anode assembly 138 may be an alternative to anode assembly 38 in the X-ray assembly 30 or similar X-ray assemblies. In some configurations, the anode assembly 138 may be used in X-ray assemblies to facilitate heat dissipation through the anode assembly 138. Such configurations may permit X-ray assemblies to operate at higher voltages and/or higher operating temperatures than the X-ray assembly 30. In some configurations, the X-ray assembly 130 may include operating voltages up to 100 Kilovolts (kV).

The anode assembly 138 may include a first portion 184 and a second portion 186 with a first taper 188 in between such that the second portion 186 includes at least one dimension (e.g. width, thickness, height, diameter, cross-sectional dimension, cross-sectional area, etc.) greater than a corresponding dimension (e.g. width, thickness, height, diameter, cross-sectional dimension, cross-sectional area, etc.) of the first portion 184. A second taper 190 may be positioned between the second portion 186 and a third portion 192 such that the third portion 192 includes at least one dimension (e.g. width, thickness, height, diameter, cross-sectional dimension, cross-sectional area, etc.) greater than a corresponding dimension (e.g. width, thickness, height, diameter, cross-sectional dimension, cross-sectional area, etc.) of the second portion 186. A target 182 may be positioned on the end of the anode assembly 138 and may define an X-ray emission face 148. A first cross-sectional dimension of the first portion 184 may be substantially the same as the area of the X-ray emission face 148. A second cross-sectional dimension of the second portion 186 may be greater than the first cross-sectional dimension. In some configurations, the first portion 184 may cylindrical, the first taper 188 may be conical, the second portion 186 may be cylindrical, the second portion 186 may cylindrical and/or the second taper 190 may be conical. In some configurations of the anode assembly 138, the first taper 188 and/or the second taper 190 may be omitted. In such configurations, the second cross-sectional dimension of the second portion 186 may be the same as the first cross-sectional dimension of the first portion 184 and/or the area of the X-ray emission face 148.

The illustrated configurations may permit the anode assembly 138 to dissipate heat more effectively than the anode assembly 38. For example, the first taper 188 may be positioned close to the X-ray emission face 148 (or closer than in comparison to the positioning of the taper 88 relative to the X-ray emission face 48). The first taper 188 may be located less than a width of the first portion 184 away from the X-ray emission face 148. In some configurations, the first portion 184 may be relatively shorter compared to the first portion 84. Accordingly, the second portion 186 may be positioned close to the X-ray emission face 148, and/or closer than the second portion 86 to the X-ray emission face 48. The larger second cross-sectional dimension of the second portion 186 may facilitate relatively higher rates of heat transfer from the target 182 when it is positioned closer to the X-ray emission face 148. Additionally or alternatively, the first cross-sectional dimension and/or the second cross-sectional dimension may be greater than corresponding dimensions of the anode assembly 38 to facilitate heat dissipation from the target 182 and/or the X-ray emission face 148. In non-illustrated configurations, the first taper 188 may extend to the end of the anode assembly 138 at the X-ray emission face 148. In such configurations, the anode assembly 138 may not include a portion corresponding to the first portion 184.

Effective heat dissipation configurations such as those described above may permit operation X-ray assemblies at relatively higher voltage and/or power capabilities. Operation of X-ray assemblies at certain high voltage and/or power levels may not be feasible in other configurations. Operating X-ray assemblies at higher voltage and/or power levels may increase the intensity of the X-rays produced by the X-ray assemblies, which may be advantageous and/or desirable for certain uses of the X-ray assemblies.

The sides of the first portion 184 and/or the sides of the second portion 186 may be transverse and/or orthogonal to the X-ray emission face 148 and/or an emission window (not illustrated). The sides of the first taper 188 and/or the second taper 190 may be transverse to the X-ray emission face 148 but may not be orthogonal to the X-ray emission face 148. In such configurations, the sides of the first taper 188 and/or the second taper 190 may be angled toward the direction of the X-ray emission face 148.

Similarly to the description with respect to FIG. 3, some electrons impacting the target 182 may be backscattered and/or absorbed by the target 182. Some of the electrons impacting the target 182 may be absorbed and radiation may be emitted from the X-ray emission face 148 and some of the electrons impacting the target 182 may be backscattered and may rebound down the length of the anode assembly 138. At any point of impact along the length of the anode assembly 138, an electron may either be absorbed or rebound. However, the likelihood of rebounding electrons decreases further along the length of the anode assembly 138 and/or decreases with each successive rebound of one of the electrons. If a rebounding electron is absorbed, it may result in an emission of radiation.

The characteristics of the emitted radiation (e.g., wavelength, frequency and/or energy) from rebounding electrons may depend on the characteristics of the impacted material, the energy of the impacting electrons, the voltage of the X-ray assembly 130, and/or other aspects. Rebounding electrons may result in spectral impurities if they cause emissions of radiation with characteristics different than the characteristics of radiation emitted from the target 182. For example, spectral impurities may result when the rebounding electrons are absorbed by a material different from the target 182 material. The spectral impurities may be undesirable for obtaining information about a sample with an energy detector (not illustrated in FIG. 4). For example, the spectral impurities may interfere with the information detected by an energy detector.

As illustrated for example in FIG. 4, the anode assembly 138 may include an anode base 174 formed of or including a material with a high thermal conductivity. In some configurations, the anode base 174 may include copper or may be formed entirely of copper. In some configurations, the anode base 174 may include the portions of the anode assembly 138 that are not the target 182. Anode assemblies that include copper may be referred to as copper anode assemblies.

In some configurations, the anode assembly 138 and the target 182 may be formed of different materials or may include different materials. The target 182 may include or may be formed of rhodium, palladium, tungsten, silver, chromium, titanium, molybdenum or other suitable materials. In some configurations, the X-ray assembly 130 may include a view factor (the configuration factor, form factor and/or shape factor) such that some of the emitted radiation from rebounding electrons may travel towards an X-ray emission window (not illustrated in FIG. 4).

The anode assembly 138 may include a coated portion 180 that may be positioned on or over a first surface of portions of the anode assembly 138. The "first surface" refers to any surfaces positioned underneath the coated portion 180 or to any surfaces that the coated portion 180 may be formed over. The coated portion 180 may surround portions of the anode assembly 138. The coated portion 180 may contribute in decreasing spectral impurities from rebounding (or backscattered) electrons. In some configurations, the coated portion 180 may be formed of (or with) the same or similar material as the target 182. In such configurations, spectral impurities may be decreased or eliminated because the radiation emitted from rebounding electrons may include characteristics similar to, or the same as, characteristics of radiation emitted from the target 182. The coated portion 180 may be formed of (or with) precious metals such as palladium, silver, rhodium, chromium, titanium or other suitable precious metals. The coated portion 180 may be formed of (or with) refractory metals such as tungsten, molybdenum or other suitable refractory metals. In some configurations, the coated portion 180 may be formed of a refractory metal coating including tungsten, molybdenum, or other suitable refractory materials. The material or materials used in the target 182 may be selected based on desired characteristics of the X-ray emissions, desired voltage, and/or power settings of the anode assembly 138, and the like.

In some configurations, the coated portion 180 may be formed of (or with) other suitable materials. Specifically, the coated portion 180 may be formed of (or with) materials that minimize spectral impurities and/or do not cause spectral impurities. For example, in some circumstances the coated portion 180 may be formed of (or with) aluminum (Al), beryllium (Be), diamond, and/or other suitable materials. In such configurations, the coated portion 180 and the target 182 may be formed and/or many include different materials.

Thus, although radiation from rebounding electrons may travel through an X-ray emission window, towards a sample and/or towards an energy detector (not illustrated in FIG. 4), such radiation may not cause spectral impurities. Accordingly, coated portions analogous to the coated portion 180 may permit configurations (e.g. shape, dimension, size, and/or positioning) of anode assemblies that may have been previously undesirable and/or unfeasible. Additionally or alternatively, coated portions analogous to the coated portion 180 may decrease or eliminate spectral impurities for existing configurations of anode assemblies.

In some configurations, the coated portion 180 may extend around the entire circumference of one or more portions of the anode assembly 138. In some configurations, the coated portion 180 may entirely cover and/or surround one or more portions of the anode assembly 138. As illustrated, the coated portion 180 may include the first portion 184, the first taper 188, the second portion 186 and the second taper 190. In such configurations, the coated portion 180 may be formed on or in the surfaces of the first portion 184, the first taper 188, the second portion 186 and/or the second taper 190.

Optionally, in other configurations, the coated portion 180 may not include the second taper 190, the second portion 186, or other portions of the anode assembly 138. In other configurations, the coated portion 180 may include other portions of the anode assembly 138 such as the third portion 192 or other portions. In some configurations, the coated portion 180 may include a portion of the anode assembly 138 adjacent to the target 182 and may extend a portion of the entire length of anode assembly 138. In some configurations, the second taper 190 may be positioned a length from the target 182 such that a small portion or none of the rebounding electrons reach the second taper 190 when the X-ray assembly 130 is operating. In such configurations, any spectral impurities caused by electrons striking the second taper 190 may be inconsequential and/or manageable, and the second taper 190 may not be part of the coated portion 180.

The coated portion 180 may extend a coated length 194 between a first limit 196 and a second limit 198. The first limit 196 may be defined by the end of the anode assembly 138, for example, at the X-ray emission face 148. Alternatively, the first limit 196 may be defined by the boundary between the target 182 and the anode assembly 138. In other configurations, the first limit 196 may be defined at other positions. The second limit 198 may be defined by the end of the coated portion 180 a distance of the coated length 194 from the first limit 196. As illustrated, the second limit 198 is positioned between the second taper 190 and the third portion 192. In other configurations, the second limit 198 may be defined at other positions. For example, if the coated portion 180 included a different coated length 194, the second limit 198 may be positioned at other positions along the length of the anode assembly 138. Whether or not the coated portion 180 includes the first portion 184, the first taper 188, the second portion 186, the second taper 190, and/or the third portion 192 or other portions may depend on the coated length 194. Depending on the coated length 194, the coated portion 180 may cover and/or surround only a part of the first portion 184, the first taper 188, the second portion 186, the second taper 190, and/or the third portion 192.

In some configurations, the coated length 194 and/or the positioning of the second limit 198 may be selected based on the behavior of the rebounding electrons. For example, the coated length 194 and/or the positioning of the second limit 198 may be selected such that rebounding electrons are unlikely (or unable) to travel further than the coated length 194. In another example, the coated length 194 and/or the positioning of the second limit 198 may be selected such that rebounding electrons are unlikely (or unable) to travel further than the coated length 194 on their first rebound, second rebound, third rebound or fourth rebound (or so on for a suitable number of rebounds). In yet another example, the coated length 194 and/or the positioning of the second limit 198 may be selected such that a majority of backscattered electrons do not travel beyond the coated portion 180. In another example, the coated length 194 and/or the positioning of the second limit 198 may be such that a majority of backscattered electrons rebounding less than two times, three times, or four times (or so on for a suitable number of rebounds) do not travel beyond the coated portion.

The coated length 194 and/or the positioning of the second limit 198 may depend on: the configuration of the X-ray assembly 130 (e.g., operating characteristics, geometry, positioning, voltage, power capacity, output radiation characteristics, materials, etc.); and/or the configuration of the anode assembly 138 (e.g., geometry, positioning, voltage, power capacity, materials, etc.) The coated length 194 and/or the positioning of the second limit 198 may be selected based on empirical evidence, modeling, simulations and/or calculations.

In some configurations, forming the coated portion 180 may include masking portions of the anode assembly 138 to avoid deposition of materials that will form the coated portion 180. For example, with reference to FIG. 4, the portions of the anode assembly 138 other than the first portion 184, the first taper 188, the second portion 186 and the second taper 190 may be masked prior to deposition. In other configurations, more or less of the anode assembly 138 may be masked. Furthermore, the target 182 may or may not be masked, depending on the desired configuration.

In some configurations, the coated portion 180 may be formed by electroplating a material onto the anode assembly 138. In some configurations, the electroplated material may include (or be entirely formed of) a precious metal (e.g., palladium, silver, rhodium, chromium, titanium, etc.) or other suitable material.

In some configurations, the coated portion 180 may be formed by thermal spraying techniques (e.g. spray deposition, spray casting, plasma spraying, and/or other suitable techniques). Spray forming may include melting a material and/or spraying the molten material to deposit droplets of the material onto the anode assembly 138 to form the coated portion 180. Spray forming may include using gas jets to break up the molten material into droplets and/or to accelerate the droplets onto the anode assembly 138. Spray forming may include arranging the process such that the droplets strike the anode assembly 138 in a semi-solid condition. Spray forming may include continuing deposition until the material is built up on the anode assembly 138 to form the coated portion 180. In some configurations, the sprayed and/or the deposited material may include (or be entirely formed of) a precious metal (e.g., palladium, silver, rhodium, chromium, titanium, etc.) a refractory metal (e.g., tungsten, molybdenum, etc.) or other suitable material.

In some configurations, the coated portion 180 may be formed by plasma spraying. Plasma spraying may include air plasma spraying, vacuum plasma spraying, or other suitable plasma spraying configurations. Plasma spraying may include generating a high-temperature plasma jet. Generating a high-temperature plasma jet may include arc discharging materials. The materials may be discharged at temperatures high enough to spray refractory materials. The material to be deposited or feedstock may be a powder, liquid, suspension, wire, or other suitable feedstock form, depending on the configuration. Plasma spraying may include introducing the feedstock may be into a plasma jet of a plasma torch. The plasma jet may melt the material and/or propel the material towards the anode assembly 138. The molten droplets may impinge the anode assembly 138, may be deposited and/or may solidify to form the coated portion 180. In some circumstances, plasma spraying may result in the coated portion 180 being adherent to the anode assembly 138. A variety of parameters may influence the properties of the deposit forming the anode assembly 138. For example, feedstock type, plasma gas composition and flow rate, energy input, torch offset distance, substrate cooling, and or other parameters may influence the plasma spraying process and the deposit properties. In some configurations, the feedstock material and/or the deposited material may include (or be entirely formed of) a precious metal (e.g., palladium, silver, rhodium, chromium, titanium, etc.) a refractory metal (e.g., tungsten, molybdenum, etc.) or other suitable material.

Plasma spraying may include vacuum plasma spraying to modify the surface of the coated portion 180 after it has been deposited. For example, plasma spraying may modify surface properties such as heat resistance, surface electrical conductivity, lubricity, frictional behavior, dielectric constant, or it can make materials hydrophilic or hydrophobic. Plasma spraying may also modify the surface by etching.

In some configurations, the coated portion 180 may be formed by chemical vapor deposition (CVD). CVD may include exposing the anode assembly 138 to a precursor gas. The precursor gas may include an element to be deposited to form the conductive or semi-conductive material on the anode assembly 138. The precursor gas may be a volatile precursor that may react and/or decompose on a surface of the anode assembly 138 to produce a deposit. The precursor gas may be diluted in carrier gases. CVD may include heating the anode assembly 138 and/or controlling the temperature of the anode assembly 138. CVD may include positioning the anode assembly 138 partially or entirely within a reaction chamber. CVD may include delivering precursor gases into a reaction chamber at certain temperatures and/or pressures. As the precursor gas passes over or comes into contact with the anode assembly 138, they may react or decompose forming a solid phase deposit onto the anode assembly 138, forming the coated portion 180. CVD may include drying, curing, firing and/or other suitable processing steps. In some configurations, the precursor gas and/or the solid phase deposit material may include (or be entirely formed of) a precious metal (e.g., palladium, silver, rhodium, chromium, titanium, etc.) a refractory metal (e.g., tungsten, molybdenum, etc.) or other suitable material.

In some configurations, the coated portion 180 may be formed by plasma-enhanced CVD (PECVD) processes. Such processes may enhance CVD processes by changing chemical reaction processes of precursors by utilizing plasma. In some circumstances, PECVD processing may allow deposition at lower temperatures.

In some configurations, the coated portion 180 may be formed by physical vapor deposition (PVD). PVD may include exposing the anode assembly 138 to a vaporized precursor to form a deposit of the coated portion 180. In some configurations, PVD may employ physical processes to form the coated portion 180 on the anode assembly 138, rather than chemical reactions. PVD may include plasma sputter bombardment of the anode assembly 138. In some configurations, the vaporized precursor and/or the deposit material may include (or be entirely formed of) a precious metal (e.g., palladium, silver, rhodium, chromium, titanium, etc.) a refractory metal (e.g., tungsten, molybdenum, etc.) or other suitable material.

In some configurations, the coated portion 180 may be formed by sputtering and/or sputter depositing of a material onto the anode assembly 138. Sputter depositing may include ejecting a deposit material onto the anode assembly 138. In some configurations, the vaporized precursor and/or the deposit material may include (or be entirely formed of) a precious metal (e.g., palladium, silver, rhodium, chromium, titanium, etc.) a refractory metal (e.g., tungsten, molybdenum, etc.) or other suitable material.

In some configurations, the coated portion 180 may be formed by high velocity oxygen fuel spraying (HVOF). HVOF may include feeding a mixture of gaseous or liquid fuel and oxygen into a combustion chamber to be ignited and combusted. The fuels may be gases (hydrogen, methane, propane, propylene, acetylene, natural gas, etc.) or liquids (kerosene, etc.). The combustion may propel hot gas at high pressure, speed, and/or flow rate through a nozzle and/or a barrel to generate a jet stream. HVOF may include injecting a feedstock into the gas stream, which accelerates the feedstock. In some configurations, the feedstock may be a powder. HVOF may include directing the stream of hot gas and feedstock towards the surface of the anode assembly 138. The feedstock may partially melt in the stream, and may be deposited on the surface of the anode assembly 138 forming the coated portion 180. In some circumstances, HVOF may result in a coated portion 180 coating with low porosity and/or high bond strength. In some configurations, the feedstock and/or the deposited material may include (or be entirely formed of) a precious metal (e.g., palladium, silver, rhodium, chromium, titanium, etc.) a refractory metal (e.g., tungsten, molybdenum, etc.) or other suitable material.

In some configurations, the coated portion 180 may be formed by cold spraying and/or gas dynamic cold spraying. Cold spraying may include accelerating solid particles to very high speeds by a carrier gas forced through a nozzle toward the anode assembly 138. Upon impact, some of the solid particles with sufficient kinetic energy may deform plastically and may bond mechanically to the anode assembly 138 to form the coated portion 180.

In some configurations, forming the coated portion 180 may include hot isostatic pressing (HIP) the coated portion 180. Hot isostatic pressing may decrease the porosity of the coated portion 180, increase the density of the coated portion 180 and/or decrease (or eliminate) discontinuities on the surface of the coated portion 180. Hot isostatic pressing may include subjecting the coated portion 180 to a high temperature environment and/or heating the coated portion 180. Hot isostatic pressing may include subjecting the coated portion 180 to a high pressure environment to compact the surface of the coated portion 180.

In some configurations, forming the coated portion 180 may include masking portions of the anode assembly 138 other than the coated portion 180 prior to deposition. Masking portions of the anode assembly 138 other than the coated portion 180 may prevent or decrease deposition of material over such portions.

In some configurations, forming the target 182 may include processing the target 182 to smooth its surface, eliminate discontinuities, and/or decrease porosity. For example, forming the target 182 may include machining the surface of the target 182. Forming the target 182 may include hot isostatic pressing the target 182. Hot isostatic pressing may decrease the porosity of the target 182 and/or increase the density of the target 182. Hot isostatic pressing may include subjecting the target 182 to a high temperature environment and/or heating the target 182. Hot isostatic pressing may include subjecting the target 182 to a high pressure environment to compact the surface of the target 182. Hot isostatic pressing may also decrease the porosity and/or increase the density of the coated portion 180 during the same process. In some configurations, masking the target 182 prior to deposition may prevent or decrease deposition of the material over the target 182. In other configurations, the deposited material may be removed by any suitable process such as machining, grinding and/or polishing.

In some circumstances, formation of the coated portion 180 may result in an edge of the coated portion 180 positioned at the second limit 198. Such an edge may create a discontinuity in the surface of the anode assembly 138. Surface discontinuities on the surface of the anode assembly 138 may result in high electrical fields, high voltage stress points, stress risers, and/or decreased stability of the anode assembly 138. Accordingly, in some configurations, the coated length 194 and/or the positioning of the second limit 198 may be selected such that the edge of the coated portion 180 does not cause negative electrical effects. For example, the coated length 194 and/or the positioning of the second limit 198 may be selected such that the edge of the coated portion 180 is a sufficient distance away from the first limit 196 such that negative electrical effects are decreased or eliminated. In some configurations, the surface of the anode assembly 138 may be processed (e.g., machined, polished, etc.) to decrease and/or eliminate discontinuities at the edge of the coated portion 180 and/or other portions of the anode assembly 138. In configurations where the coated length 194 is sufficiently long, processing to eliminate discontinuities may not be necessary or desirable.

Figure 5A:
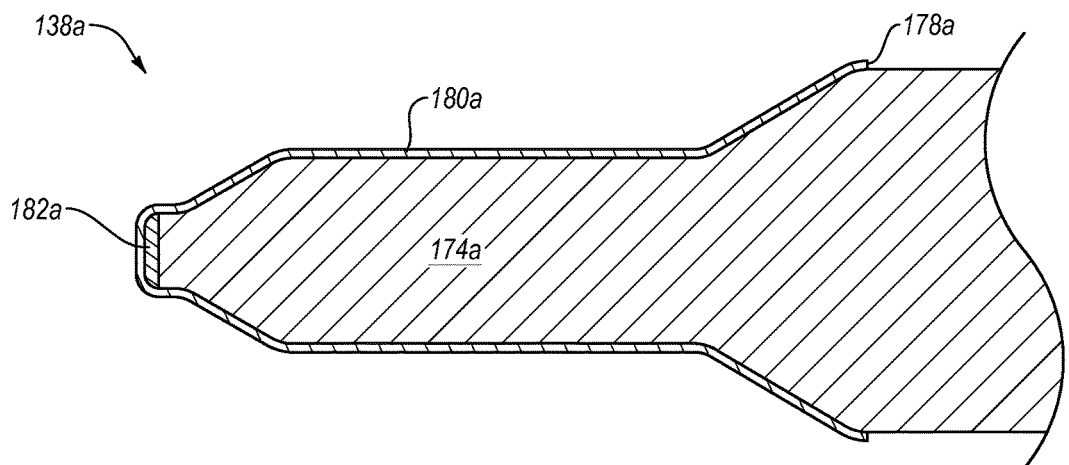
FIGS. 5A-5C are cross-sectional views of portions of various X-ray assemblies.
Figure 5B:
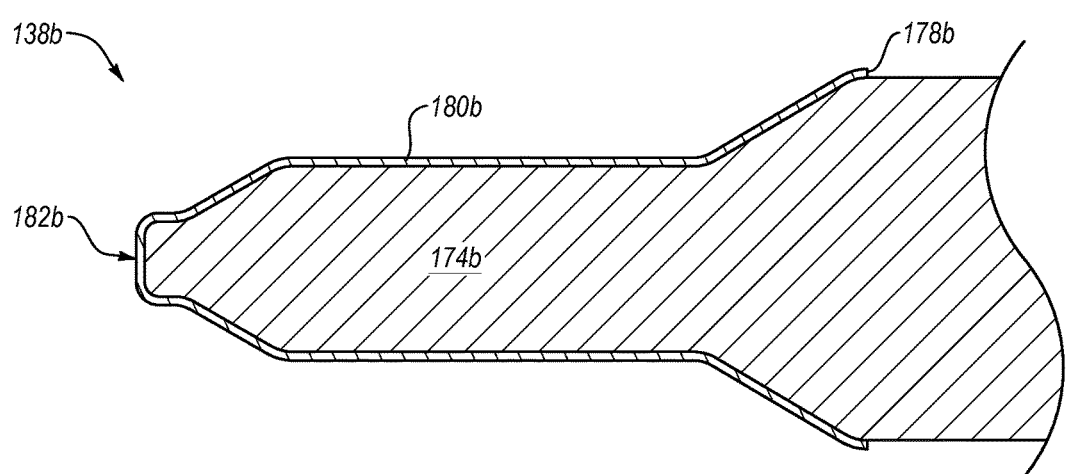
Figure 5C:
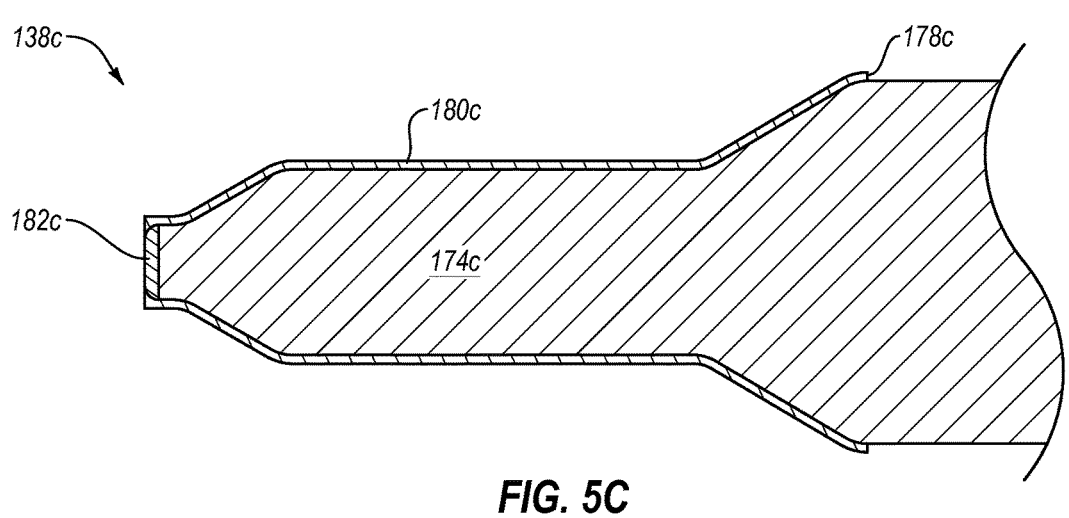

FIGS. 5A-5C are cross-sectional views of portions of various X-ray assemblies. Turning to FIGS. 5A-5C, anode assemblies 138a, 138b, and 138c will be described in further detail. The anode assemblies 138a-c may each include corresponding anode bases 174a-c formed of a base material (or a "first material"). In some configurations, the anode bases 174a-c may be formed of or include a material with high heat conductivity, for example, copper or gold. The anode assemblies 138a-c may also include coated portions 180a-c corresponding to coated portion 180. The coated portions 180a-c may include any suitable aspects described with respect to coated portion 180 and/or may be formed by any suitable methods described with respect to coated portion 180.

As illustrated in FIG. 5A, in some configurations the anode assembly 138a may include a target 182a coupled to the anode base 174a, and the coated portion 180a may be positioned over the target 182a and at least a portion of the anode base 174a. In some configurations, the target 182a may be coupled to the anode assembly 138a before the coated portion 180a is formed. Depending on the process used to form the coated portion 180a, material may be deposited over the target 182a in forming the coated portion 180a.

As illustrated in FIG. 5C, in some configurations the anode assembly 138c may include a target 182c coupled to the anode base 174c, and the coated portion 180c may be positioned over at least a portion of the anode base 174c, but not over the face of the target 182c. In such configurations, the target 182c may be coupled to the anode base 174c before the coated portion 180c is formed. The target 182c may be masked prior to deposition of material to form the coated portion 180c to prevent or decrease deposition of material over the face of the target 182c, Alternatively, material may be deposited over the target 182c as illustrated, for example, in FIG. 5A, and the material deposited over the face of the target 182c may be removed by any suitable process such as machining, grinding and/or polishing.

In some configurations, removal of the deposited material over the face of the target 182c may not be necessary. For example, turning to FIG. 5A, if the target 182a and the coated portion 180a are formed of the same material, removal of the deposited material over the face of the target 182a may not be necessary. Nevertheless, in some configurations, the surface of the deposited material over the target 182a may be finished by any suitable finishing process such as machining and/or polishing. The finishing process may smooth the surface, eliminate discontinuity, decrease the porosity, increase density and/or compact the material of the target 182a.

In some configurations, forming the target 182a may include processing at least a portion of the coated portion 180a to smooth its surface, eliminate discontinuities, and/or decrease porosity. For example, forming the target 182a may include machining the surface of the coated portion 180*a* corresponding to the target 182*a*. Forming the target 182*a* may include hot isostatic pressing at least the portion of the coated portion 180*a* corresponding to the target 182*a*. Forming the coated portion 180*a* may include hot isostatic pressing the entire coated portion 180*a*. Hot isostatic pressing may decrease the porosity of the coated portion 180*a* and/or increase the density of the coated portion 180*a*. Hot isostatic pressing may include subjecting the coated portion 180*a* to a high temperature environment and/or heating the coated portion 180*a*. Hot isostatic pressing may include subjecting the coated portion 180*a* to a high pressure environment to compact the surface of the coated portion 180*a*.

As illustrated in FIG. 5B, in some configurations, the anode assembly 138*b* may not include a target coupled to the anode base 174*b*. In such configurations, the coated portion 180*b* may be formed over at least a portion of the anode base 174*a* including a portion corresponding to the positioning of a target 182*b*. In such configurations, the target 182*b* may be formed as part of the coated portion 180*b*. For example, the target 182*b* may be deposited by the same processes as the coated portion 180*b* during its formation. In such configurations, formation of the anode assembly 138*b* may not include coupling a separate target to the anode assembly 138*b*. Accordingly, forming the target 182*b* may include electroplating, thermal spraying, plasma spraying, CVD, PECVD, PVD, HVOF, and/or cold spraying.

In some configurations, forming the target 182*b* may include processing at least a portion of the coated portion 180*b* to smooth its surface, eliminate discontinuities, and/or decrease porosity. For example, forming the target 182*b* may include machining the surface of the coated portion 180*b* corresponding to the target 182*b*. Forming the target 182*b* may include hot isostatic pressing at least the portion of the coated portion 180*b* corresponding to the target 182*b*. Forming the coated portion 180*b* may include hot isostatic pressing the entire coated portion 180*b*. Hot isostatic pressing may decrease the porosity of the coated portion 180*b* and/or increase the density of the coated portion 180*b*. Hot isostatic pressing may include subjecting the coated portion 180*b* to a high temperature environment and/or heating the coated portion 180*b*. Hot isostatic pressing may include subjecting the coated portion 180*b* to a high pressure environment to compact the surface of the coated portion 180*b*.

Turning to FIG. 5C, in some configurations forming the target 182*c* may include processing the target 182*c* to smooth its surface, eliminate discontinuities, and/or decrease porosity. For example, forming the target 182*c* may include machining target 182*c*. Forming the target 182*c* may include hot isostatic pressing the target 182*c*. Forming the target 182*c* may include hot isostatic pressing the target 182*c*. Hot isostatic pressing may decrease the porosity of the target 182*c* and/or increase the density of the target 182*c*. Hot isostatic pressing may include subjecting the entire anode assembly 138*c* to a high temperature environment and/or heating the anode assembly 138*c*. Hot isostatic pressing may include subjecting the anode assembly 138*c* to a high pressure environment to compact the surface of the coated portion 180*c* and/or the target 182*c*.

As illustrated in FIGS. 5A-5C, in some circumstances formation of the coated portion such as coated portions 180*a-c* may result in an edge such as edges 178*a-c*. Such edges 178*a-c* may generally be positioned on the anode assemblies 138*a-c* at a position corresponding to the second limit 198. Such edges 178*a-c* may create discontinuities in the surface of the anode assemblies 138*a-c*. Surface discontinuities on the surface of the anode assemblies 138*a-c* may result in high electrical fields, high voltage stress points, stress risers, and/or decreased stability of the anode assemblies 138*a-c*. Accordingly, in some configurations, the length of the coated portions 180*a-c* (generally corresponding to coated length 194) and/or the positioning of the edges 178*a-c* (generally corresponding to the second limit 198) may be selected such that the edges 178*a-c* of the coated portions 180*a-c* do not cause negative electrical effects. For example, the length of the coated portions 180*a-c* and/or the positioning of the edges 178*a-c* may be selected such that the edge of the coated portion 180 are a sufficient distance away from the targets 182*a-c* such that negative electrical effects are decreased or eliminated. In some configurations, the surface of the anode assemblies 138*a-c* may be processed (e.g., machined, polished, etc.) to eliminate and/or decrease discontinuities at the edges 178*a-c* of the coated portions 180*a-c* and/or other portions of the anode assemblies 138*a-c*. In configurations where the lengths of the coated portions 180*a-c* are sufficiently long, processing to eliminate discontinuities may not be necessary or desirable.

The coated portion 180 and/or 180*a-c* may be one or more of: an electroplated precious metal; a sprayed precious metal; a sprayed refractory metal; a chemical vapor deposited precious metal; a chemical vapor deposited refractory metal; a physical vapor deposited precious metal; and/or a physical vapor deposited refractory metal.

Some or all of the coated portions 180*a-c* may include a coating thickness. The coating thickness may include a minimum thickness such that electrons do not penetrate through the coated portions 180*a-c*. The coated portions 180*a-c* may include a minimum thickness such that electrons do not penetrate through the coated portions 180*a-c* to the respective one of the anode base 174*a-c* materials. In some circumstances, a diffused layer may be formed between one or more of the coated portions 180*a-c* and one or more respective one of the anode base 174*a-c* materials. The diffused layer may be formed at or near the interface of one of the coated portions 180*a-c* and the respective one of the anode base 174*a-c* materials. The diffused layer may include the anode base 174*a-c* material and/or the material of the coated portions 180*a-c*. In such configurations, the coated portions 180*a-c* may include a minimum thickness such that electrons do not penetrate through the coated portions 180*a-c* to the diffused layer.

In some configurations, an intermediate layer may be formed between the coated portions 180*a-c* and the anode base 174*a-c* to prevent diffusion of the anode base material and the material of the coated portions 180*a-c*. In some configurations, the intermediate layer may be formed over the anode base 174*a-c* prior to the formation of the coated portions 180*a-c*.

In this description, the term "substantially" means that the recited characteristic, parameter, or value need not be achieved exactly, but that deviations or variations, including for example, tolerances, measurement error, measurement accuracy limitations and other factors known to those skilled in the art, may occur in amounts that do not preclude the effect the characteristic was intended to provide.

The terms and words used in this description and claims are not limited to the bibliographical meanings, but, are merely used to enable a clear and consistent understanding of the disclosure. The singular forms "a," "an," and "the" include plural referents unless the context clearly dictates otherwise. Thus, for example, reference to "a component surface" includes reference to one or more of such surfaces. If a specific number is explicitly recited in connection with an element, it means at least the recited number, unless the context clearly dictates otherwise. For example, the bare recitation of "two recitations," without other modifiers, means at least two recitations, or two or more recitations.

Aspects of the present disclosure may be embodied in other forms without departing from its spirit or essential characteristics. The described aspects are to be considered in all respects illustrative and not restrictive. The claimed subject matter is indicated by the appended claims rather than by the foregoing description. All changes which come within the meaning and range of equivalency of the claims are to be embraced within their scope.

What is claimed is:

1. A method of forming an X-ray assembly comprising:
providing an anode comprising an anode base formed of a first material and including a first end; and
depositing a second material different from the first material over a first surface of the anode base to form a coated portion of the anode base;
wherein the coated portion is configured such that a majority of electrons backscattered from a target of the anode do not travel beyond the coated portion.

2. The method of claim 1, the anode base further comprising a taper between a first portion with a first cross-sectional dimension, a second portion with a second cross-sectional dimension greater than the first cross-sectional dimension, wherein the first end is positioned at the first portion.

3. The method of claim 2, further comprising coupling the target that defines an X-ray emission face at the first end of the anode base prior to forming the coated portion of the anode base, the target including the second material.

4. The method of claim 3, wherein depositing the second material over the first surface includes depositing the second material over the target, and the method further comprising removing at least a portion of the deposited second material positioned over the X-ray emission face of the target.

5. The method of claim 2, wherein depositing the second material over the first surface includes depositing the second material over the first end to form the target that defines an X-ray emission face over the first end of the anode base.

6. The method of claim 1, wherein the coated portion extends from a first limit to a second limit, the second limit configured such that a majority of electrons backscattered from the target of the anode do not travel beyond the coated portion.

7. The method of claim 6, wherein the first limit is defined at the first end.

8. The method of claim 1, wherein the coated portion extends from a first limit to a second limit, the coated portion configured such that a majority of electrons backscattered from the target of the anode that rebound less than three times do not travel beyond the coated portion.

9. The method of claim 2, wherein the coated portion of the anode base includes the first portion, the taper, and the second portion.

10. The method of claim 2, wherein the coated portion of the anode base includes the first portion, the taper, the second portion, and a second taper proximate the second portion.

11. The method of claim 1, wherein depositing the second material includes electroplating a precious metal on the first surface of the anode base.

12. The method of claim 1, wherein depositing the second material includes thermal spraying, plasma spraying, high velocity oxygen fuel spraying, or cold spraying a precious metal or a refractory metal on the first surface of the anode base.

13. The method of claim 1, wherein depositing the second material includes chemical vapor depositing or physical vapor depositing a precious metal or a refractory metal on the first surface of the anode base.

14. The method of claim 1, further comprising one or more of:
hot isostatic pressing the deposited second material;
machining the deposited second material;
finishing the deposited second material; and/or
removing at least a portion of the deposited second material.

15. The method of claim 14, wherein the one or more of the hot isostatic pressing, the machining, the finishing, and/or the removing at least a portion of the deposited second material forms the target defining an X-ray emission face over the first end of the anode base.

16. The method of claim 1, wherein the first material includes copper and the second material includes one or more of: palladium, silver, rhodium, chromium, titanium, tungsten, molybdenum, aluminum, beryllium, and/or diamond.

17. The method of claim 1, further comprising forming the target on the first end including a third material different from the first material and the second material.

* * * * *